(12) United States Patent
Hwang

(10) Patent No.: US 7,919,351 B2
(45) Date of Patent: Apr. 5, 2011

(54) CMOS IMAGE SENSOR WITH MULTI-LAYERED PLANARIZATION LAYER AND METHOD FOR FABRICATING THE SAME

(75) Inventor: Jong-Taek Hwang, Cheongju-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 253 days.

(21) Appl. No.: 12/211,124

(22) Filed: Sep. 16, 2008

(65) Prior Publication Data

US 2009/0072285 A1    Mar. 19, 2009

(30) Foreign Application Priority Data

Sep. 19, 2007    (KR) .................. 10-2007-0095210

(51) Int. Cl.
*H01L 21/00* (2006.01)
*H01L 21/31* (2006.01)
*H01L 21/469* (2006.01)
*H01L 31/062* (2006.01)
*H01L 31/113* (2006.01)
*H01L 31/00* (2006.01)

(52) U.S. Cl. ... 438/70; 257/294; 257/440; 257/E27.134; 438/783

(58) Field of Classification Search .................. 438/783, 438/69–72; 257/294, 440, E27.134
See application file for complete search history.

(56) References Cited

U.S. PATENT DOCUMENTS

| | | | |
|---|---|---|---|
| 5,677,234 A * | 10/1997 | Koo et al. ...................... 438/439 |
| 6,379,992 B2 * | 4/2002 | Jo ..................................... 438/70 |
| 7,129,108 B2 * | 10/2006 | Jang ................................. 438/70 |
| 7,166,484 B2 * | 1/2007 | Lee ................................... 438/29 |
| 2006/0138497 A1 * | 6/2006 | Kim ................................ 257/294 |

* cited by examiner

Primary Examiner — David S Blum
Assistant Examiner — Daniel Luke
(74) Attorney, Agent, or Firm — Sherr & Vaughn, PLLC

(57) ABSTRACT

A CMOS image sensor and a method for fabricating the same for preventing contamination and peeling of an array of micro lenses. The CMOS image sensor includes a plurality of photodiodes formed on and/or over a substrate, an insulating film formed on and/or over an entire surface of the substrate including the photodiodes, color filter layers formed on and/or over the insulating film, a first oxide film formed on and/or over the color filter layers, an ion-rich oxide film formed by injecting silicon ions into the first oxide film, a second oxide film formed on and/or over the ion-rich oxide film, and a micro lens pattern formed corresponding to the photodiodes by patterning the second oxide film.

17 Claims, 4 Drawing Sheets

CMOS IMAGE SENSOR WITH MULTI-LAYERED PLANARIZATION LAYER AND METHOD FOR FABRICATING THE SAME

The present application claims priority under 35 U.S.C. §119 to Korean Patent Application No. 10-2007-0095210 (filed on Sep. 19, 2007), which is hereby incorporated by reference in its entirety.

BACKGROUND

An image sensor is a semiconductor device which converts an optical image into an electrical signal. Image sensors may be classified into charge coupled device (CCD) image sensors and complementary metal oxide semiconductor (CMOS) image sensors. CMOS image sensors may include a photodiode for sensing light and a CMOS logic circuit for processing the sensed light into an electrical signal to generate data. As the amount of light received in the photodiode increases, the photo sensitivity of the image sensor is enhanced. The photo sensitivity can be enhanced by increasing a fill factor (a ratio of the area of the photodiode to the entire area of the image sensor) or changing a traveling path of light incident on the area other than the photodiode such that the light is condensed into the photodiode. An example of light-condensing techniques is formation of an array of micro lenses. Micro lenses such as convex micro lenses composed of a material having high light transmissivity, are formed over the photodiode so that incident light can be refracted through the micro lenses to thereby radiate a larger quantity of light toward the photodiode area. In this case, light parallel to the optic axis of the micro lens is refracted by the micro lens to form a focal point at a certain position of the optic axis.

An image sensor includes a photodiode, an interlayer insulation layer, a color filter, a micro lens and the like. The photodiode senses light and converts the sensed light into an electrical signal. The interlayer insulation layer is provided for insulation between metal lines. The color filter represents three primary colors (RGB) of light and the micro lens condenses light into the photodiode.

Figure 1:
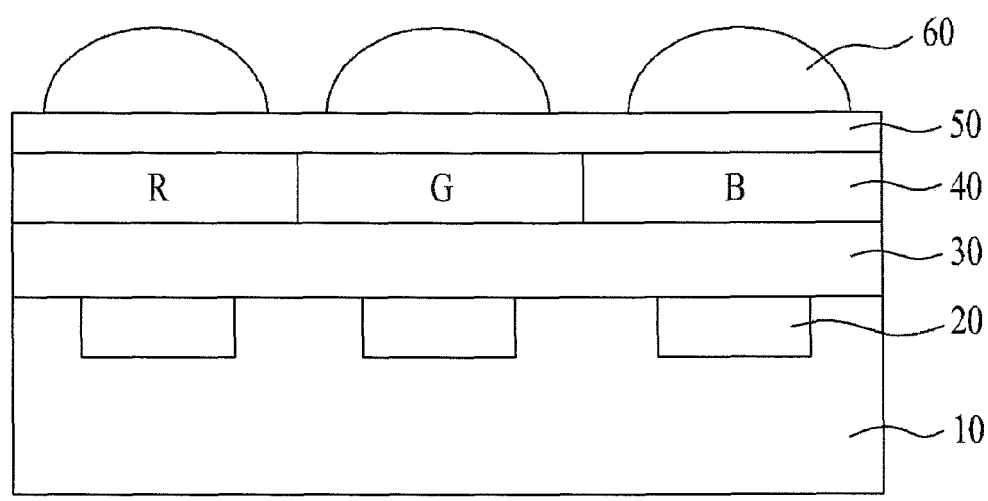

As illustrated in example FIG. 1, a CMOS image sensor may include interlayer insulation layer 30 formed on and/or over semiconductor substrate 10 having a plurality of photodiodes 20. RGB color filter layers 40 are formed on and/or over interlayer insulation layer 30 corresponding to photodiodes 20. Planarization layer 50 is formed on and/or over RGB color filter layers 40 to planarize a nonuniform surface layer of color filter layers 40. An array of micro lenses 60 are formed on and/or over planarization layer 50 corresponding to photodiodes 20 and color filter layers 40.

In such a CMOS image sensor, however, an oxide film for forming the micro lenses is not dense and may produce a plurality of pin holes. The pin holes allow an etching solution to infiltrate into the oxide film in a subsequent etching process, thereby causing peeling of the micro lenses. Further, after the oxide film is etched, in a subsequent sawing process, particles may be stuck in the micro lenses, thereby causing contamination of the micro lenses.

SUMMARY

Embodiments relate to an image sensor and a method for fabricating the same for preventing contamination and peeling of a micro lens.

Embodiments relate to a CMOS image sensor and a method for fabricating the same for preventing contamination and peeling of a micro lens due to an etching solution infiltrated through a number of pin holes formed in an oxide film deposited at a low temperature.

Embodiments relate to a CMOS image sensor that may include at least one of the following: a plurality of photodiodes formed on and/or over a substrate; an insulating film formed on and/or over an entire surface of the substrate including the photodiodes; color filter layers formed on and/or over the insulating film; a first oxide film formed on and/or over the color filter layers; a rich oxide film formed by injecting ions into the first oxide film; a second oxide film formed on and/or over the rich oxide film; and a micro lens pattern formed corresponding to the photodiodes by patterning the second oxide film. In accordance with embodiments, the rich oxide film is formed by injecting silicon ions into the first oxide film.

Embodiments relate to a method for fabricating a CMOS image sensor that may include at least one of the following steps: forming a plurality of photodiodes on and/or over a substrate; and then forming an insulating film on and/or over an entire surface of the substrate including the photodiodes; and then forming color filter layers on and/or over the insulating film; and then forming a first oxide film on and/or over the color filter layers; and then forming a rich oxide film by injecting ions into the first oxide film; and then forming a second oxide film on and/or over the rich oxide film; and then forming a plurality of micro lenses corresponding to the photodiodes by patterning the second oxide film.

Embodiments relate to a method for fabricating a CMOS image sensor that may include at least one of the following steps: forming a plurality of photodiodes over a substrate; and then forming an insulating film over an entire surface of the substrate including the photodiodes; and then forming color filter layers over the insulating film; and then forming a first oxide film having a multilayered structure over the color filter layers; and then forming a second oxide film over the first oxide film; and then forming a plurality of micro lenses corresponding to the photodiodes by patterning the second oxide film. In accordance with embodiments, the first oxide layer includes a silicon-rich first oxide film formed over a non-silicon rich first oxide film.

Embodiments relate to a method that may include at least one of the following steps: forming an insulating film over a substrate having a plurality of photodiodes formed therein; and then forming color filter layers over the insulating film; and then forming a first oxide film over the color filter layers; and then forming a second oxide film by injecting ions into the first oxide film; and then forming a third oxide film over the ion-rich oxide film; and then forming a plurality of micro lenses composed of the third oxide film.

DRAWINGS

Example FIG. 1 illustrates a CMOS image sensor.
Example FIGS. 2A to 2G illustrate a method for fabricating a CMOS image sensor in accordance with embodiments.

DESCRIPTION

Reference will now be made in detail to embodiments, examples of which are illustrated in the accompanying drawings. Wherever possible, the same reference numbers will be used throughout the drawings to refer to the same or like parts.

Figure 2A:
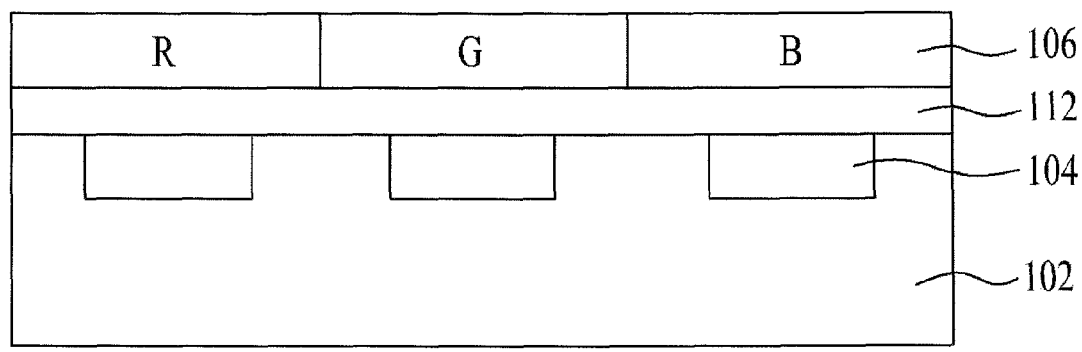

As illustrated in example FIG. 2A, insulating film 112 is formed on and/or over semiconductor substrate 102 having a plurality of photodiodes 104 formed therein. Insulating film 112 may be formed by stacking a plurality of layers. For example, insulating layer 112 may include nitride film for preventing light from being incident on and/or over other areas than photodiodes 104 and an oxide film for protecting the device from external moisture or impact. Color filter layers 106 of red (R), green (G) and blue (B) are then formed on and/or over insulating film 112. Color filter layers 106 are formed by coating a corresponding photosensitive material and performing a photolithography process to filter light according to the respective wavelength bands. A light-shielding film may be formed between the color filter layers of red (R), green (G) and blue (B) to prevent color mixture between neighboring pixels.

Figure 2B:
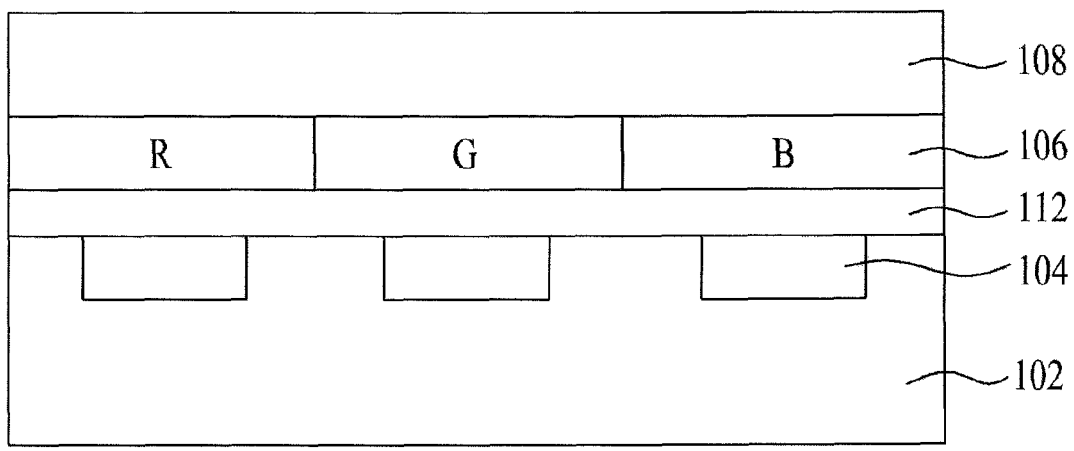

As illustrated in example FIG. 2B, first oxide film 108 may then be formed on and/or over color filter layers 106. First oxide film 108 may be formed by one of chemical vapor deposition (CVD), plasma enhanced chemical vapor deposition (PECVD) and the like. First oxide film 108 is formed to have a thickness in a range between 1,000 to 2,000 Å.

Figure 2C:
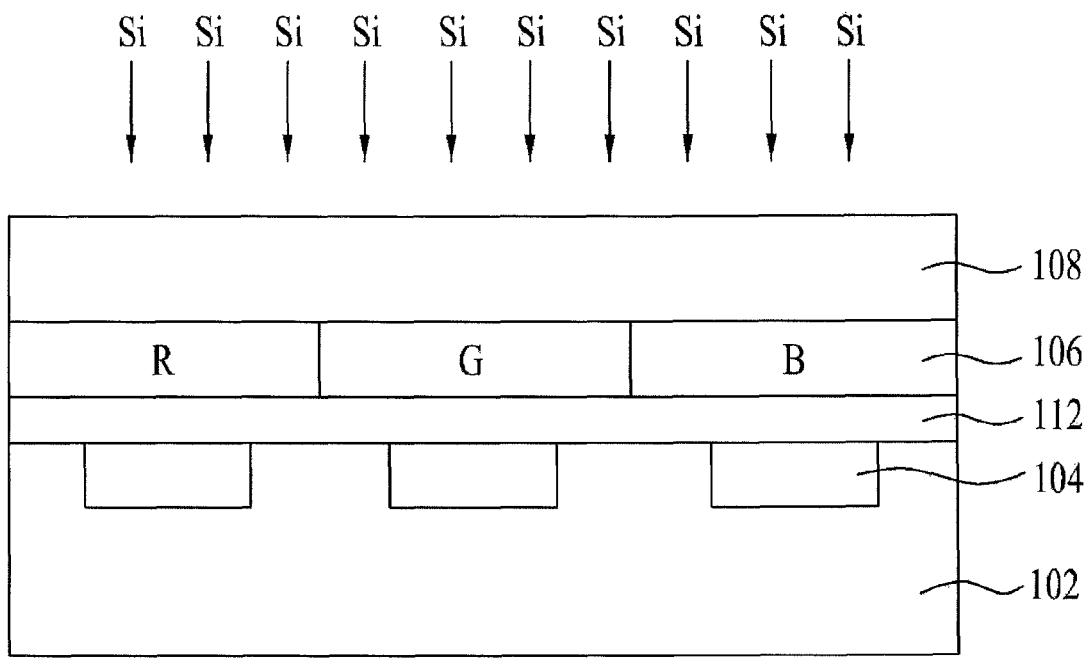
Figure 2D:
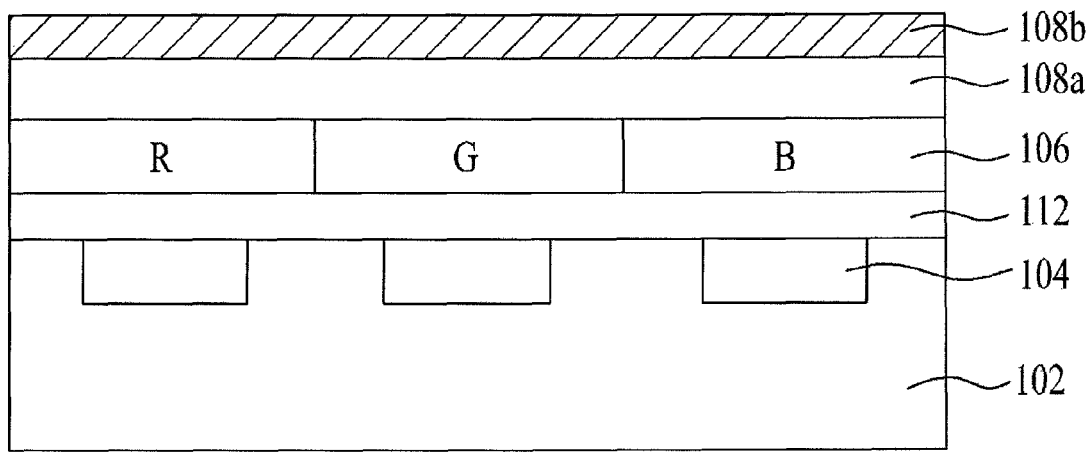

As illustrated in example FIGS. 2C and 2D, silicon (Si) ions are then injected to form first oxide film 108 composed of silicon-rich oxide film 108b and oxide film 108a. Silicon ions are injected at a dosage in a range between 5E13 to 5E14 atoms/cm$^2$ with injection energy in a range between 250 to 750 KeV.

Figure 2E:
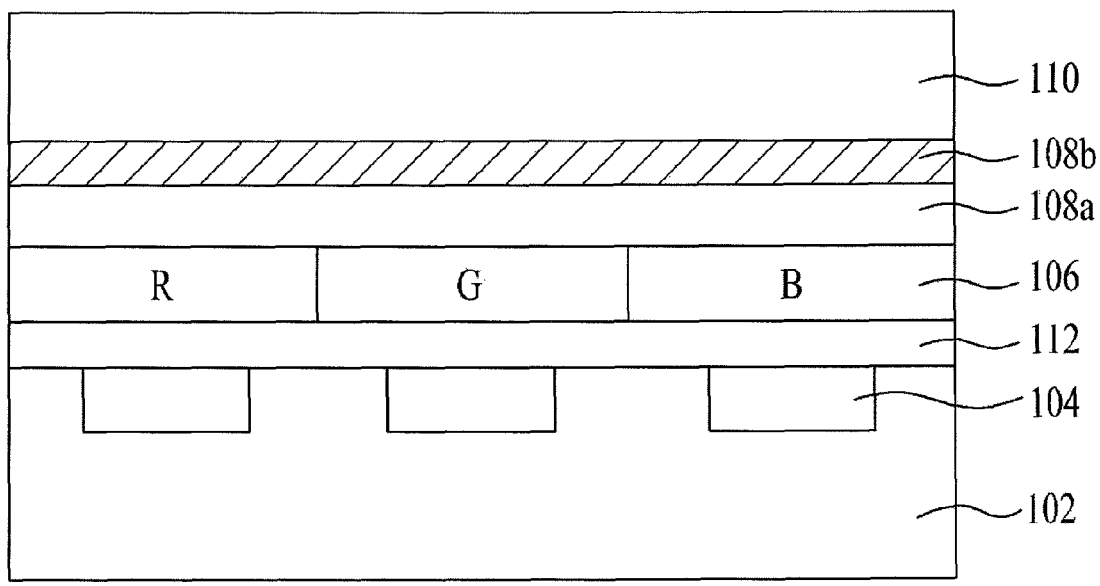

As illustrated in example FIG. 2E, second oxide film 110 for forming an array of micro lenses is then formed on and/or over silicon-rich oxide film 108b. Second oxide film 110 is formed by at least one of chemical vapor deposition (CVD), plasma enhanced chemical vapor deposition (PECVD) and the like. Second oxide film 110 is formed of a material that can be deposited at low temperatures, for example, PE-oxide or PE-TEOS. Second oxide film 110 is formed to have a thickness in a range between 1,000 to 3,000 Å.

Figure 2F:
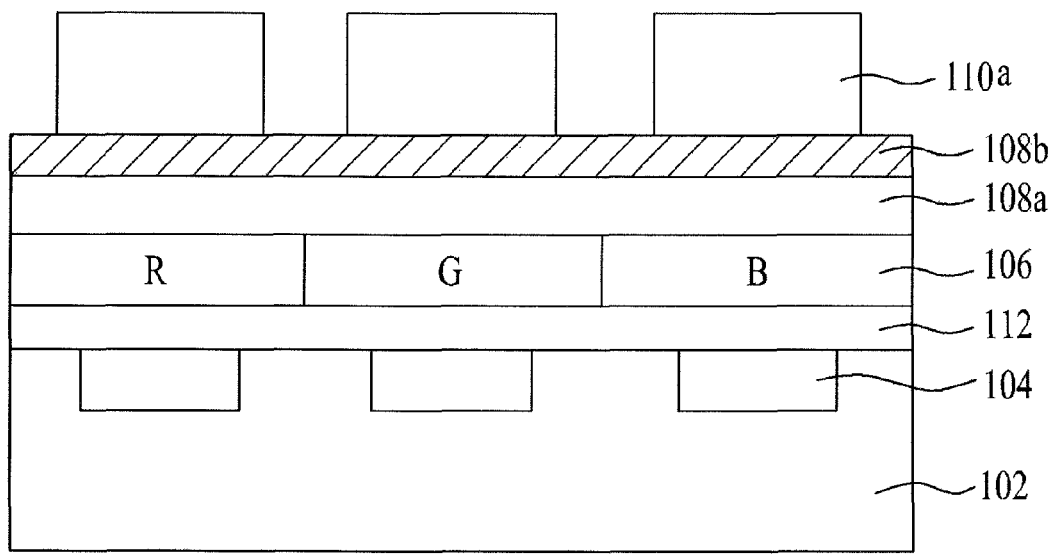

As illustrated in example FIG. 2F, second oxide film 110 is patterned by a photolithography process to form an array of micro-lens patterns 110a at regions corresponding to photodiodes 104.

Figure 2G:
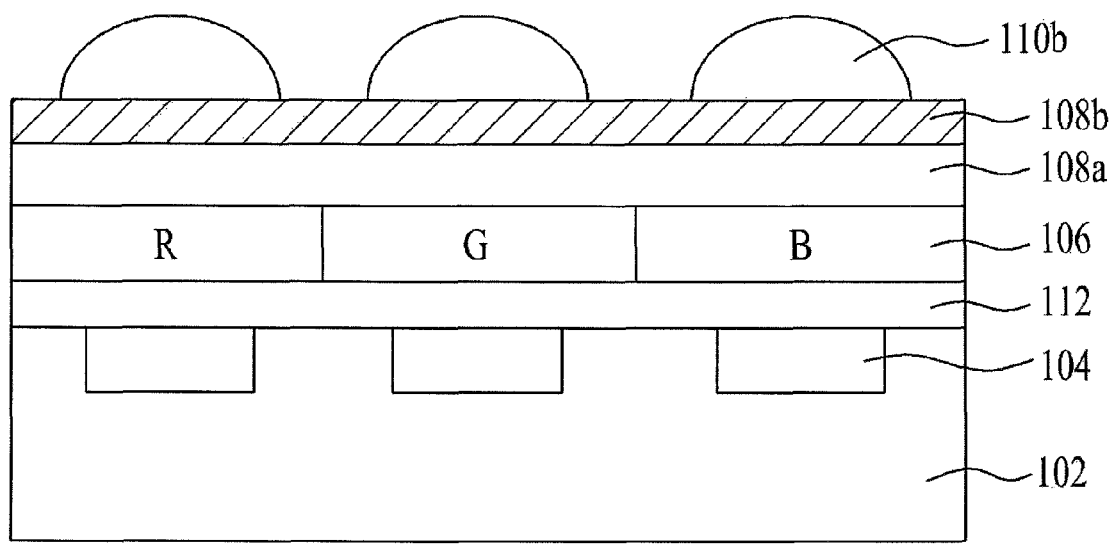

As illustrated in example FIG. 2G, micro-lens patterns 110a are reflowed by baking to form hemispherical micro lenses 110b.

In the CMOS image sensor formed in accordance with embodiments, silicon-rich oxide film 108b is formed to prevent infiltration of an etching solution during formation of micro lenses 110b. Micro lenses 110b are formed of an oxide film to prevent peeling due to infiltration of an etching solution and contamination of particles formed in a sawing process. In the CMOS image sensor and the method for fabricating the CMOS image sensor.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A CMOS image sensor comprising:
    a plurality of photodiodes formed in a substrate;
    an insulating film formed over an entire surface of the substrate including the photodiodes;
    color filter layers formed over the insulating film;
    a first oxide film formed over the color filter layers;
    an ion-rich oxide film formed over the first oxide film;
    a micro lens array composed of a second oxide film formed on the ion-rich oxide film and corresponding to the photodiodes,
    wherein the ion-rich oxide film is formed by injecting silicon ions into the first oxide film.

2. The CMOS image sensor of claim 1, wherein the first oxide film and the second oxide film are formed by at least one of chemical vapor deposition (CVD) and plasma enhanced chemical vapor deposition (PECVD).

3. The CMOS image sensor of claim 1, wherein the second oxide film is formed of at least one of PE-oxide and PE-TEOS.

4. A method for fabricating a CMOS image sensor comprising:
    forming a plurality of photodiodes over a substrate; and then
    forming an insulating film over an entire surface of the substrate including the photodiodes; and then
    forming color filter layers over the insulating film; and then
    forming a first oxide film having a multilayered structure over the color filter layers; and then
    forming a second oxide film over the first oxide film; and then
    forming a plurality of micro lenses corresponding to the photodiodes by patterning the second oxide film,
    wherein the multilayer structure comprises a silicon-rich first oxide layer formed over a non-silicon rich first oxide layer.

5. The method of claim 4, wherein the second oxide film is formed of at least one of PE-oxide and PE-TEOS.

6. The method of claim 5, wherein the second oxide film is formed to have a thickness in a range between 1,000 to 3,000 Å.

7. The method of claim 4, wherein the second oxide film is formed to have a thickness in a range between 1,000 to 3,000 Å.

8. The method of claim 4, wherein the first oxide film and the second oxide film are formed by at least one of chemical vapor deposition (CVD) and plasma enhanced chemical vapor deposition (PECVD).

9. The method of claim 4, wherein forming the first oxide film comprises:
    depositing an oxide film over the color filter layers; and then
    injecting silicon ions into the oxide film to form the silicon-rich first oxide layer over a non-silicon rich first oxide layer.

10. A method comprising:
    forming an insulating film over a substrate having a plurality of photodiodes formed therein; and then
    forming color filter layers over the insulating film; and then
    forming a first oxide film over the color filter layers; and then
    forming a second oxide film by injecting ions into the first oxide film; and then
    forming a third oxide film over the second oxide film; and then
    forming a plurality of micro lenses composed of the third oxide film,
    wherein forming the second oxide film comprises injecting silicon (Si) ions in the first oxide film to form a silicon-rich oxide film.

11. The method of claim 10, wherein the insulating film comprises a nitride layer and an oxide insulating layer.

12. The method of claim 10, wherein forming the first oxide film comprises depositing the first oxide film using at least one of chemical vapor deposition (CVD) and plasma enhanced chemical vapor deposition (PECVD).

13. The method of claim 12, wherein the first oxide film is formed to have a thickness in a range between 1,000 to 2,000 Å.

14. The method of claim 10, wherein the silicon ions are injected at a dosage in a range between 5E13 to 5E14 atoms/cm2 with an injection energy in a range between 250 to 750 KeV.

15. The method of claim 10, wherein forming the third oxide film comprises depositing at least one of PE-oxide and PE-TEOS using at least one of chemical vapor deposition (CVD) and plasma enhanced chemical vapor deposition (PECVD).

16. The method of claim 15, wherein the at least one of PE-oxide and PE-TEOS is formed to have a thickness in a range between 1,000 to 3,000 Å.

17. The method of claim 10, wherein forming the micro lenses comprises:
  patterning the third oxide film to form an array of micro-lens patterns corresponding to the photodiodes; and then reflowing the micro-lens patterns.

* * * * *